(12) United States Patent
Jung et al.

(10) Patent No.: US 7,764,537 B2
(45) Date of Patent: Jul. 27, 2010

(54) SPIN TRANSFER TORQUE MAGNETORESISTIVE RANDOM ACCESS MEMORY AND DESIGN METHODS

(75) Inventors: Seong-Ook Jung, Seoul (KR); Seung H. Kang, San Diego, CA (US); Sei Seung Yoon, San Diego, CA (US); Mehdi Hamidi Sani, Rancho Santa Fe, CA (US)

(73) Assignee: QUALCOMM Incorporated, San Diego, CA (US)

( * ) Notice: Subject to any disclaimer, the term of this patent is extended or adjusted under 35 U.S.C. 154(b) by 169 days.

(21) Appl. No.: 11/972,674

(22) Filed: Jan. 11, 2008

(65) Prior Publication Data

US 2008/0247222 A1 Oct. 9, 2008

Related U.S. Application Data

(60) Provisional application No. 60/910,255, filed on Apr. 5, 2007.

(51) Int. Cl.
*G11C 11/00* (2006.01)
(52) U.S. Cl. ............... 365/158; 365/161; 365/171; 365/173
(58) Field of Classification Search ................ 365/158, 365/161, 171, 173
See application file for complete search history.

(56) References Cited

U.S. PATENT DOCUMENTS

| | | | |
|---|---|---|---|
| 6,269,018 B1 | 7/2001 | Monsma et al. | |
| 6,744,086 B2 * | 6/2004 | Daughton et al. | 257/295 |
| 6,798,623 B2 * | 9/2004 | Seigler et al. | 360/324 |
| 6,809,900 B2 * | 10/2004 | Covington | 360/125.01 |
| 7,224,601 B2 * | 5/2007 | Panchula | 365/158 |
| 7,332,781 B2 | 2/2008 | Nozieres, et al. | |
| 7,492,622 B2 * | 2/2009 | Parkin et al. | 365/80 |
| 7,495,867 B2 * | 2/2009 | Sbiaa et al. | 360/324.11 |
| 2007/0030724 A1 | 2/2007 | Hosomi et al. | |
| 2009/0265678 A1 * | 10/2009 | Jung et al. | 716/17 |

FOREIGN PATENT DOCUMENTS

FR 2829868 3/2003

OTHER PUBLICATIONS

International Search Report—PCT/US08/059600—International Search Authority, European Patent Office—Sep. 2, 2008.
Written Opinion—PCT/US08/059600— International Search Authority, European Patent Office—Sep. 2, 2008.
Hosomi, M., et al. "A Novel Nonvolatile Memory with Spin Torque Transfer Magnetization Switching: Spin-RAM", IEEE Sony Corporation 2005.

* cited by examiner

*Primary Examiner*—Viet Q Nguyen
(74) *Attorney, Agent, or Firm*—Sam Talpalatsky; Nicholas J. Pauley; Peter M. Kamarchik

(57) ABSTRACT

Systems, circuits and methods for determining read and write voltages for a given word line transistor in Spin Transfer Torque Magnetoresistive Random Access Memory (STT-MRAM) are disclosed. A first voltage can be supplied to the write operations so that the write operations occur in the saturation region of the word line transistor. A second voltage, which is less than the first voltage, can be supplied for read operations so that the read operations occur in the linear region of the word line transistor.

20 Claims, 8 Drawing Sheets

PARALLEL MAGNETIZATION
LOW RESISTANCE
STATE "0"

ANTIPARALLEL MAGNETIZATION
HIGH RESISTANCE
STATE "1"

READ & WRITE

SPIN TRANSFER TORQUE MAGNETORESISTIVE RANDOM ACCESS MEMORY AND DESIGN METHODS

CLAIM OF PRIORITY UNDER 35 U.S.C. §119

The present Application for Patent claims priority to Provisional Application No. 60/910,255, entitled "SPIN TRANSFER TORQUE MAGNETORESISTIVE RANDOM ACCESS MEMORY WITH REDUCED READ VOLTAGE" filed Apr. 5, 2007, and assigned to the assignee hereof and hereby expressly incorporated by reference herein.

FIELD OF DISCLOSURE

Embodiments of the invention are related to random access memory (RAM). More particularly, embodiments of the invention are related to memory design in Spin Transfer Torque Magnetoresistive Random Access Memory (STT-MRAM).

BACKGROUND

Random access memory (RAM) is a ubiquitous component of modem digital architectures. RAM can be stand alone devices or can be integrated or embedded within devices that use the RAM, such as microprocessors, microcontrollers, application specific integrated circuits (ASICs), system-on-chip (SoC), and other like devices as will be appreciated by those skilled in the art. RAM can be volatile or non-volatile. Volatile RAM loses its stored information whenever power is removed. Non-volatile RAM can maintain its memory contents even when power is removed from the memory. Although non-volatile RAM has advantages in the ability to maintain its contents without having power applied, conventional non-volatile RAM has slower read/write times than volatile RAM.

Magnetoresistive Random Access Memory (MRAM) is a non-volatile memory technology that has response (read/write) times comparable to volatile memory. In contrast to conventional RAM technologies which store data as electric charges or current flows, MRAM uses magnetic elements. As illustrated in FIGS. 1A and 1B, a magnetic tunnel junction (MTJ) storage element 100 can be formed from two magnetic layers 110 and 130, each of which can hold a magnetic field, separated by an insulating (tunnel barrier) layer 120. One of the two layers (e.g., fixed layer 110), is set to a particular polarity. The other layer's (e.g., free layer 130) polarity 132 is free to change to match that of an external field that can be applied. A change in the polarity 132 of the free layer 130 will change the resistance of the MTJ storage element 100. For example, when the polarities are aligned, FIG. 1A, a low resistance state exists. When the polarities are not aligned, FIG. 1B, then a high resistance state exists. The illustration of MTJ 100 has been simplified and those skilled in the art will appreciate that each layer illustrated may comprise one or more layers of materials, as is known in the art.

Referring to FIG. 2A, a memory cell 200 of a conventional MRAM is illustrated for a read operation. The cell 200 includes a transistor 210, bit line 220, digit line 230 and word line 240. The cell 200 can be read by measuring the electrical resistance of the MTJ 100. For example, a particular MTJ 100 can be selected by activating an associated transistor 210, which can switch current from a bit line 220 through the MTJ 100. Due to the tunnel magnetoresistive effect, the electrical resistance of the MTJ 100 changes based on the orientation of the polarities in the two magnetic layers (e.g., 110, 130), as discussed above. The resistance inside any particular MTJ 100 can be determined from the current, resulting from the polarity of the free layer. Conventionally, if the fixed layer 110 and free layer 130 have the same polarity, the resistance is low and a "0" is read. If the fixed layer 110 and free layer 130 have opposite polarity, the resistance is higher and a "1" is read.

Referring to FIG. 2B, the memory cell 200 of a conventional MRAM is illustrated for a write operation. The write operation of the MRAM is a magnetic operation. Accordingly, transistor 210 is off during the write operation. Current is propagated through the bit line 220 and digit line 230 to establish magnetic fields 250 and 260 that can affect the polarity of the free layer of the MTJ 100 and consequently the logic state of the cell 200. Accordingly, data can be written to and stored in the MTJ 100.

MRAM has several desirable characteristics that make it a candidate for a universal memory, such as high speed, high density (i.e., small bitcell size), low power consumption, and no degradation over time. However, MRAM has scalability issues. Specifically, as the bit cells become smaller, the magnetic fields used for switching the memory state increase. Accordingly, current density and power consumption increase to provide the higher magnetic fields, thus limiting the scalability of the MRAM.

Unlike conventional MRAM, Spin Transfer Torque Magnetoresistive Random Access Memory (STT-MRAM) uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM). During the write operation, the spin-polarized electrons exert a torque on the free layer, which can switch the polarity of the free layer. The read operation is similar to conventional MRAM in that a current is used to detect the resistance/logic state of the MTJ storage element, as discussed in the foregoing. As illustrated in FIG. 3A, a STT-MRAM bit cell 300 includes MTJ 305, transistor 310, bit line 320 and word line 330. The transistor 310 is switched on for both read and write operations to allow current to flow through the MTJ 305, so that the logic state can be read or written.

Referring to FIG. 3B, a more detailed diagram of a STT-MRAM cell 301 is illustrated, for further discussion of the read/write operations. In addition to the previously discussed elements such as MTJ 305, transistor 310, bit line 320 and word line 330, a source line 340, sense amplifier 350, read/write circuitry 360 and bit line reference 370 are illustrated. As discussed above, the write operation in an STT-MRAM is electrical. Read/write circuitry 360 generates a write voltage between the bit line 320 and the source line 340. Depending on the polarity of the voltage between bit line 320 and source line 340, the polarity of the free layer of the MTJ 305 can be changed and correspondingly the logic state can be written to the cell 301. Likewise, during a read operation, a read current is generated, which flows between the bit line 320 and source line 340 through MTJ 305. When the current is permitted to flow via transistor 310, the resistance (logic state) of the MTJ 305 can be determined based on the voltage differential between the bit line 320 and source line 340, which is compared to a reference 370 and then amplified by sense amplifier 350. Those skilled in the art will appreciate the operation and construction of the memory cell 301 is known in the art. Additional details are provided, for example, in M. Hosomi, et al., A Novel Nonvolatile Memory with Spin Transfer Torque Magnetoresistive Magnetization Switching: Spin- RAM, proceedings of IEDM conference (2005), which is incorporated herein by reference in its entirety.

The electrical write operation of STT-MRAM eliminates the scaling problem due to the magnetic write operation in MRAM. Further, the circuit design is less complicated for STT-MRAM. However, because both read and write operations are performed by passing current through the MTJ 305, there is a potential for read operations to disturb the data stored in the MTJ 305. For example, if the read current is similar to or greater in magnitude than the write current threshold, then there is a substantial chance the read operation may disturb the logic state of MTJ 305 and thus degrade the integrity of the memory.

SUMMARY

Exemplary embodiments of the invention are directed to systems, circuits and methods for a reduced read voltage in a Spin Transfer Torque Magnetoresistive Random Access Memory (STT-MRAM).

Accordingly, an embodiment of the invention can include a method for designing Spin Transfer Torque Magnetoresistive Random Access Memory (STT-MRAM) comprising: obtaining a characteristic curve for an access transistor; determining a state0 resistance and a state1 resistance of a magnetic tunnel junction (MTJ) storage element, corresponding to a first and second state of the memory; determining a write voltage such that the operating points of both the first state and second state write operations intercept the characteristic curve in a saturated region; and determining a read voltage such that the operating points of both the first state and second state read operations intercept the characteristic curve in a linear region.

Access Memory (STT-MRAM) having a plurality of bit cells, each bit cell comprising: a magnetic tunnel junction (MTJ) storage element having a state0 resistance and a state1 resistance, corresponding to a first and second state of the memory; an access transistor coupled in series with the MTJ between a bit line and a source line, wherein a gate of the access transistor is coupled to a word line; a supply voltage (VDD) coupled to the bit line or source line during write operations; and a read voltage (VR) coupled to the bit line during a read operation, and wherein the read voltage is selected such that the access transistor operates in a linear region during read operations and wherein the access transistor operates in a saturation region during write operations.

Another embodiment of the invention includes a computer-readable medium including code stored thereon for designing Spin Transfer Torque Magnetoresistive Random Access Memory (STT-MRAM) comprising: code for causing a computer to load a characteristic curve for an access transistor; code for causing a computer to determine a state0 resistance and a state1 resistance of a magnetic tunnel junction (MTJ) storage element, corresponding to a first and second state of the memory; code for causing a computer to determine a write voltage such that the operating points of both the first state and second state write operations intercept the characteristic curve in a saturated region; and code for causing a computer to determine a read voltage such that the operating points of both the first state and second state read operations intercept the characteristic curve in a linear region.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of embodiments of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of embodiments of the invention.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

As discussed in the background, STT-MRAM uses a low write current for each cell, which is an advantage of this memory type over MRAM. However, in conventional designs cell read current can approach or be higher than the write current threshold and thus cause an invalid write operation/destructive read to occur.

Figure 1A:
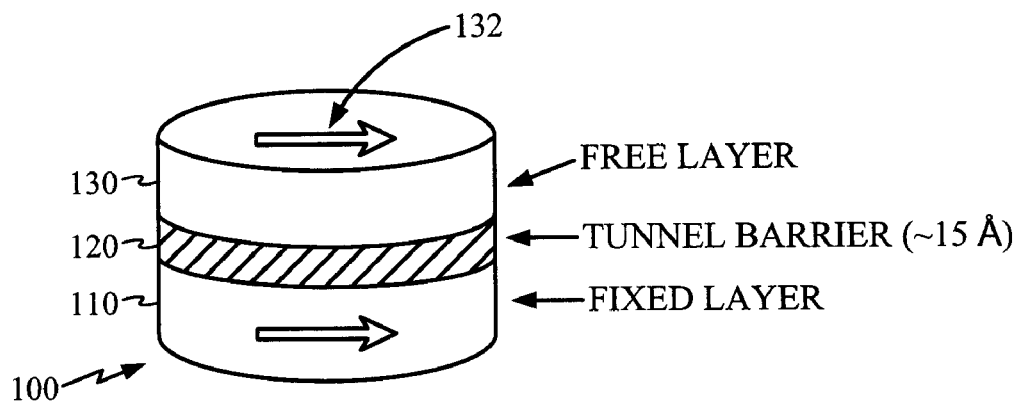
FIGS. 1A and 1B are illustrations of a magnetic tunnel junction (MTJ) storage element.
Figure 1B:
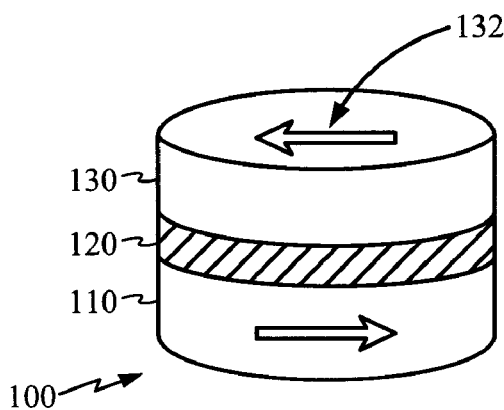
Figure 2A:
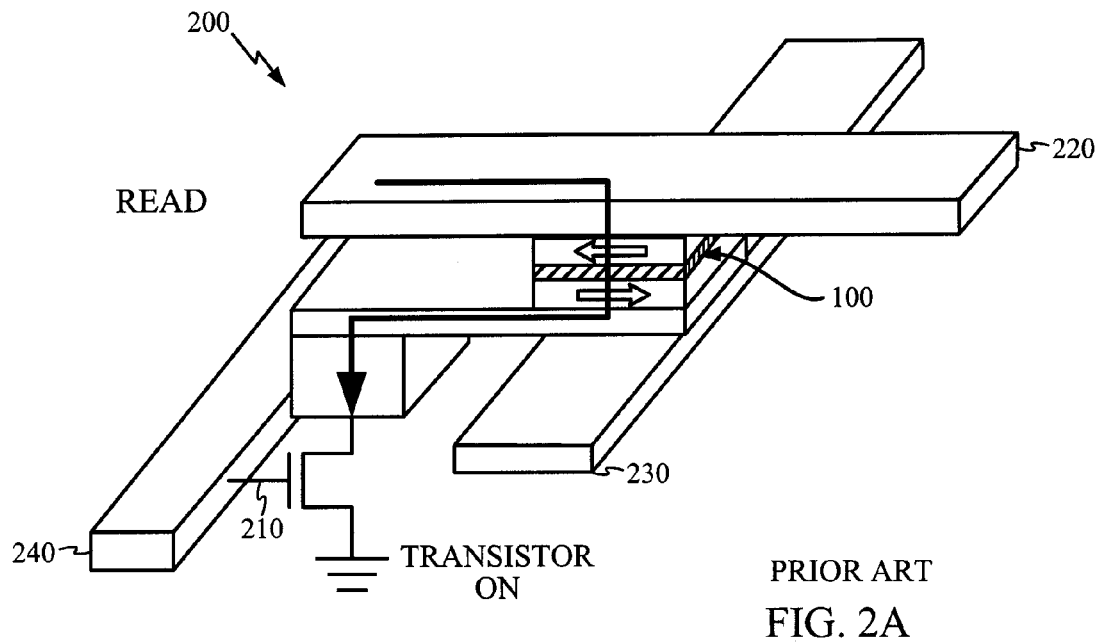
FIGS. 2A and 2B are illustrations of a Magnetoresistive Random Access Memory (MRAM) cell during read and write operations, respectively.
Figure 2B:
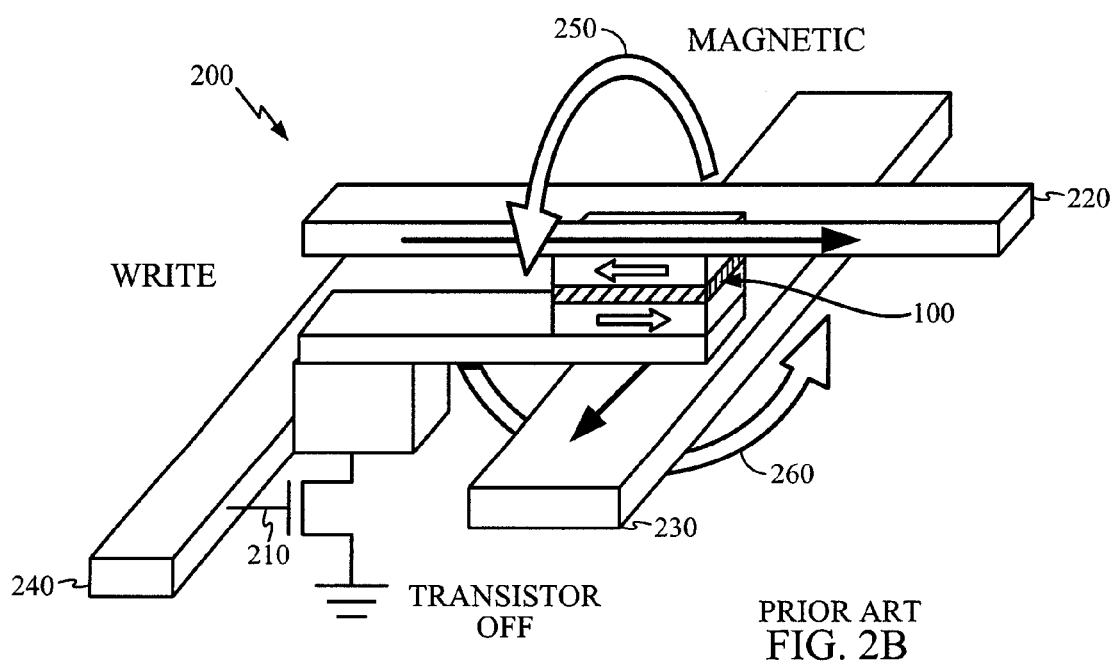
Figure 3A:
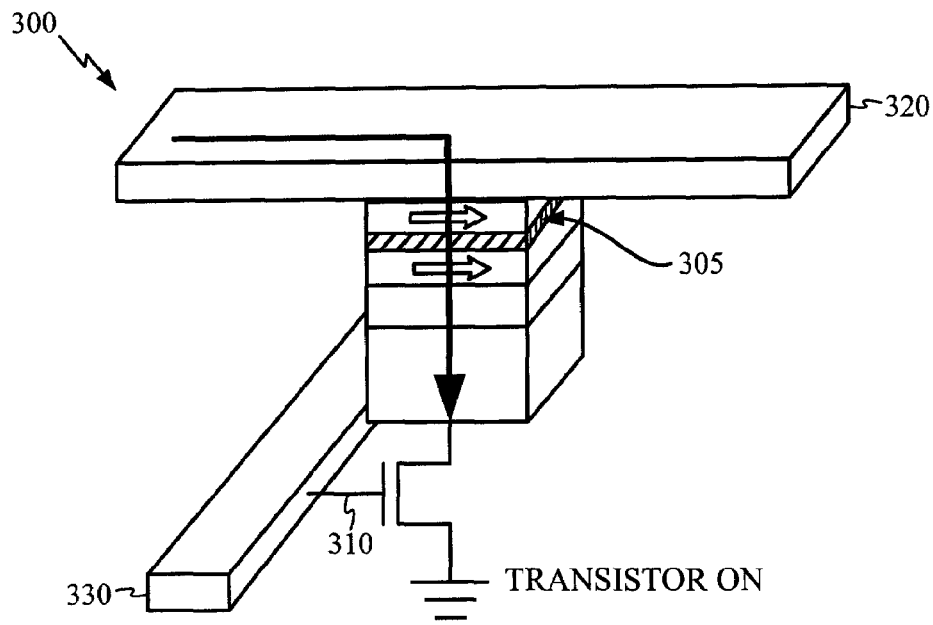
FIGS. 3A and 3B are illustrations of Spin Transfer Torque Magnetoresistive Random Access Memory (STT-MRAM) cells.
Figure 3B:
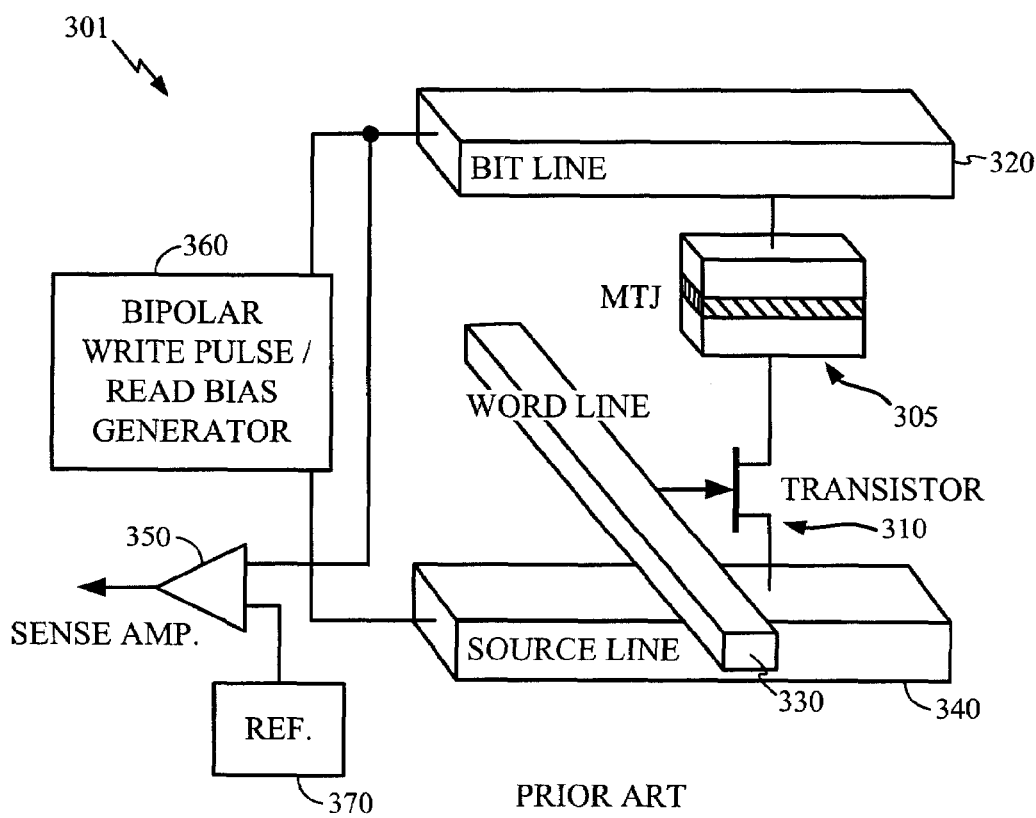
Figure 4A:
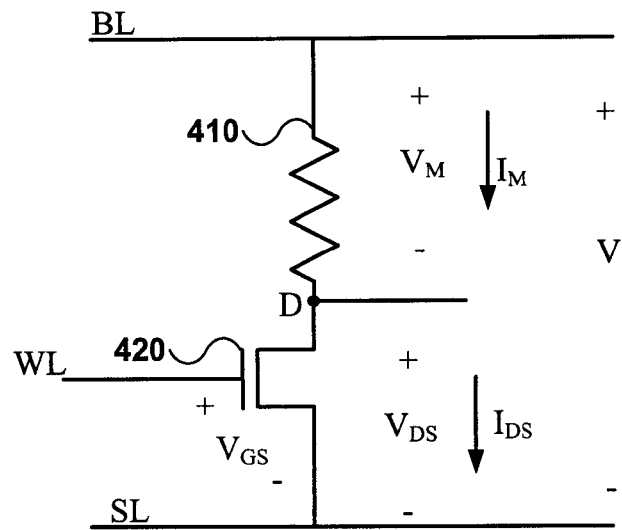
FIG. 4A is a simplified schematic representation of a STT-MRAM cell.

Referring to FIG. 4A, a simplified schematic of an STT-MRAM cell is illustrated. The MTJ is represented by resistance (R) 410 and is in series with the access transistor 420 between the bit line (BL) and source line (SL). The cell operation can be considered to have three modes; Breakdown; Read; and Write. A large cell current difference between state0 and state1 is desired for proper sensing operation. In the Write mode, the write operation is a bidirectional operation to write state0 and state1, as previously discussed. A low write current is used for low power operation. Some of the design challenges for this memory cell include that the read and write operations use the same path and are electrical. Accordingly, a destructive read will occur if the read current is greater than the minimum write current. Further, the Breakdown mode can occur if the voltage across the MTJ (e.g., $V_M$) during a write operation is higher than $V_{breakdown}$. The voltage (V) is the sum of the voltage across the MTJ ($V_M$) and the drain-source voltage ($V_{DS}$). The voltage across the MTJ can be determined as:

$$I_M = \frac{V_M}{R} = \frac{V - V_{DS}}{R},$$

and the drain-source current ($I_{DS}$) can be determined as function of the gate-source voltage ($V_{GS}$), drain-source voltage ($V_{DS}$), the transistor threshold voltage ($V_t$), and channel width to channel length ratio (W/L), which can be give as:

$I_{DS} = f(V_{GS}, V_{DS}, V_t, W/L).$

The gate-source voltage ($V_{GS}$) can be determined as:

$V_{GS} = V_{WL} - V_{SL},$ where $V_{WL}$ is the voltage on the word line and $V_{SL}$ is the voltage on the source line. The drain-source voltage ($V_{DS}$) can be determined as:

$V_{DS} = V_D - V_{SL},$ where $V_D$ is the voltage at node D between the MTJ 410 and the access transistor 420. The voltage (V) can also be determined as:

$V = V_{BL} - V_{SL},$ where $V_{BL}$ is the voltage on the bit line. Additionally, the conditions for the linear region and saturation region of the access transistor can be defined as:

Linear region: $V_{GS} - V_T > V_{DS}$

Saturation region: $V_{GS} - V_T \leq V_{DS}$

Figure 4B:
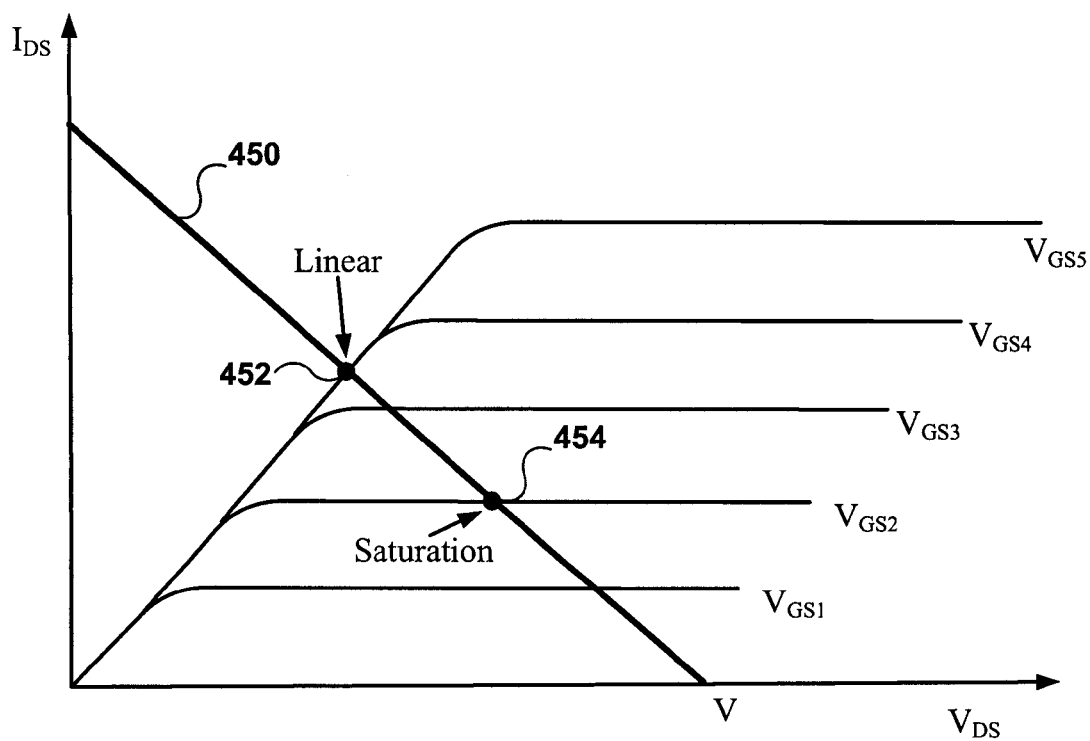
FIG. 4B is a graph illustrating characteristic curves for a word line transistor and load line indicating various operating points.

In addition to the simplified schematic, characteristic curves for the access (or word line) transistor 420 are provided in FIG. 4B. The characteristic curves are a family of curves, each of which is a plot of drain-source current ($I_{DS}$) versus drain-source voltage ($V_{DS}$) for a particular gate-source voltage ($V_{GS}$). In addition to the characteristic curves a load line 450 is plotted. Load line 450 intersects the linear region of the characteristic curves at point 452 and a saturation region at point 454, as can be seen from FIG. 4B.

Figure 5A:
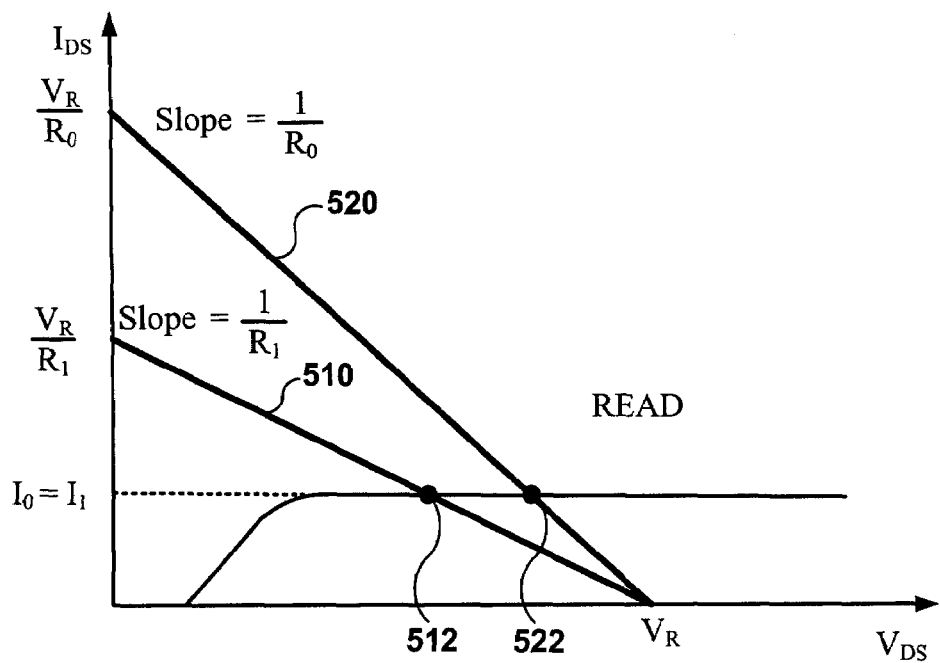
FIG. 5A is a graph illustrating a characteristic curve for a word line transistor and load lines indicating various read operating points in the saturated region.

FIG. 5A illustrates a load line for the read operation of a state0, 520, and a load line for the read operation of a state 1, 510, for a given read voltage $V_R$. Load line 520 has a slope of $1/R_0$, where $R_0$ is the state0 resistance of the MTJ. Likewise, load line 510 has a slope of $1/R_1$, where $R_1$ is the state1 resistance of the MTJ. Both lines intersect the drain-source voltage ($V_{DS}$) line at point $V_R$ and intersect the saturated portion of the access transistor curve at points 512 and 522, respectively. Since both states are operating in the saturated portion, the read current for state0 is substantially equal to the read current for state1 (i.e., $I_0 = I_1$). Accordingly, if the read operation occurs in the saturated region then it will be difficult to detect the state of the MTJ as the read currents for both states will be similar.

Figure 5B:
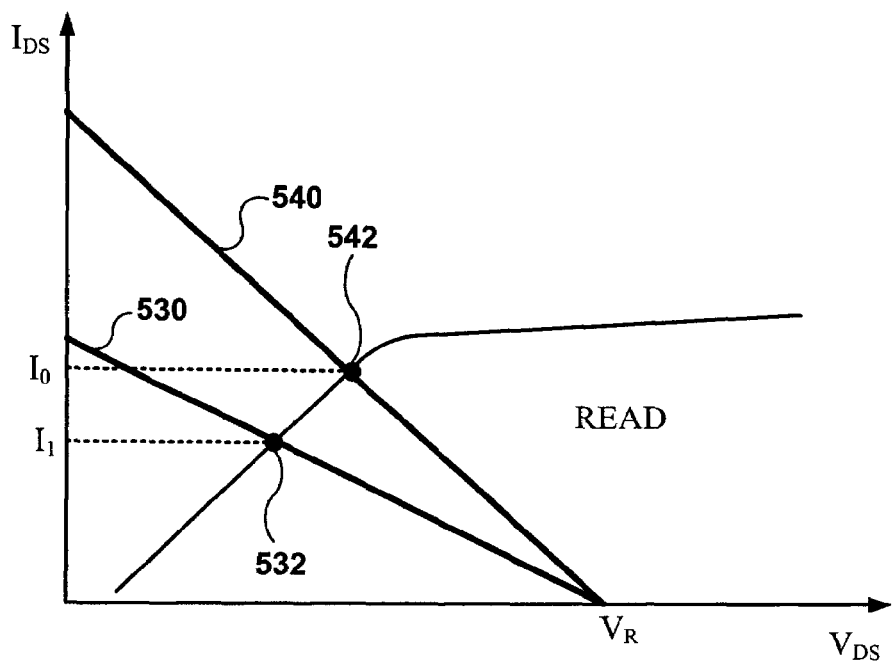
FIG. 5B is a graph illustrating a characteristic curve for a word line transistor and load lines indicating various read operating points in the linear region.

The read mode operation can be designed to have a significant current difference between state0 and state1, if it is designed to operate in the linear region. FIG. 5B illustrates a load line for the read operation of a state0 540 and a load line for the read operation of a state1 530 for a given read voltage $V_R$ and a given gate-source voltage ($V_{GS}$). Load line 540 has a slope of $1/R_0$, where $R_0$ is the state0 resistance of the MTJ. Likewise, load line 530 also has a slope of $1/R_1$, where $R_1$ is the state1 resistance of the MTJ. Both lines intersect the drain-source voltage line at point $V_R$. However, in this configuration, the load lines intersect the linear portion of the access transistor curve at points 532 and 542 for $R_1$ and $R_0$, respectively. By operating in the linear portion during the read operation, the read current for state0 can be greater than the read current for state1 (i.e., $I_0 > I_1$), as can be seen from FIG. 5B. The design target of having a significant current difference between state0 and state1 can be achieved. Accordingly, the state of the MTJ will be easier to detect based on the different currents and read errors can be reduced. Other factors can also increase the current difference, such as a smaller on-state resistance $R_{on}$ of the word line (or access) transistor. Additionally, the difference between $R_0$ and $R_1$ will also tend to increase the current difference during the read operation.

Figure 6A:
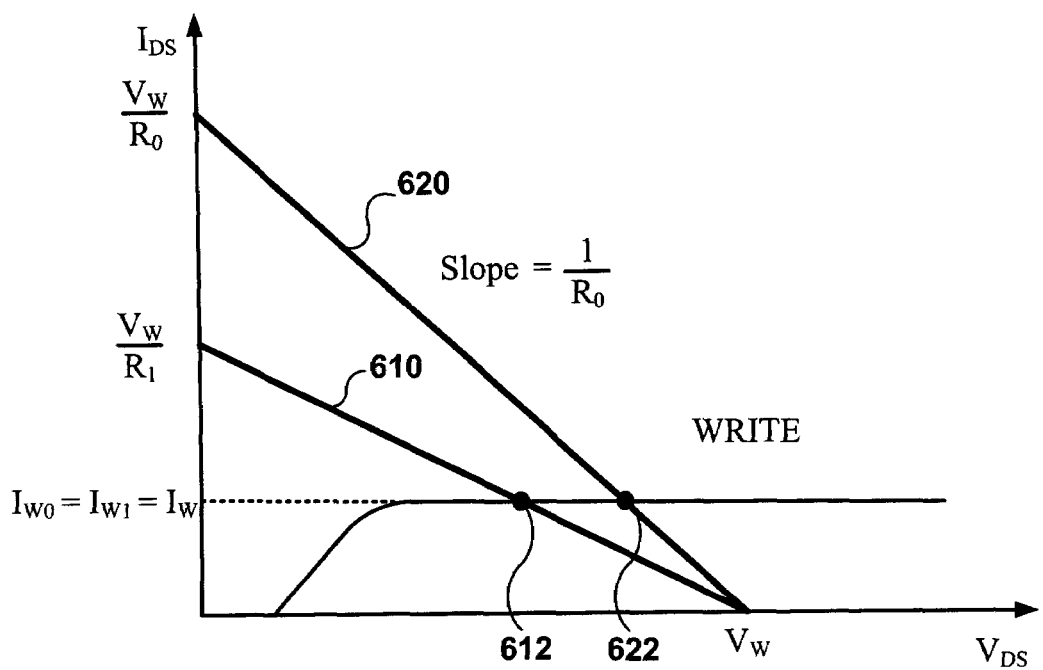
FIG. 6A is a graph illustrating a characteristic curve for a word line transistor and load lines indicating various write operating points in the saturated region.
Figure 6B:
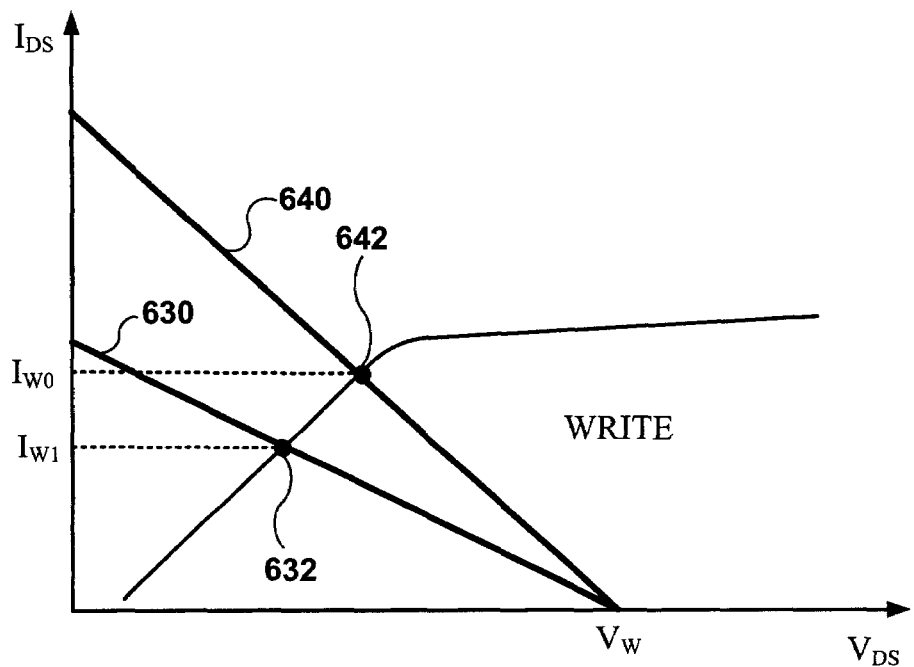
FIG. 6B is a graph illustrating a characteristic curve for a word line transistor and load lines indicating various write operating points in the linear region.

In contrast to the read operation, the write operation can have a similar current magnitude for each state and preferably has as low a write current, as possible reduce power consumption. Load lines for the write operation are illustrated in FIG. 6A and 6B. In FIG. 6A, a load line for the write operation of a state0 620 and a load line for the write operation of a state1 610 for a given write voltage $V_W$, is illustrated. Load line 620 has a slope of $1/R_0$, where $R_0$ is the state0 resistance of the MTJ. Likewise, load line 610 has a slope of $1/R_1$, where $R_1$ is the state1 resistance of the MTJ. Both lines intersect the drain-source voltage line at point $V_W$ and intersect the saturated portion of the word line transistor at points 612 and 622, respectively. Since both states are operating in the saturated portion, the magnitude of the write current for state0 can be substantially equal to the magnitude of the write current for state1 (i.e., $I_{W0} = I_{W1} = I_W$).

Alternatively, FIG. 6B illustrates a load line that intersects in the saturated region for the write operation of a state0 640 and a load line for the write operation of a state1 630 for a given write voltage $V_W$. Load line 640 also has a slope of $1/R_0$, where $R_0$ is the state0 resistance of the MTJ. Likewise, load line 630 also has a slope of $1/R_1$, where $R_1$ is the state1 resistance of the MTJ. Both lines intersect the drain-source voltage line ($V_{DS}$) at point $V_W$. However, in this configuration, the load lines intersect the linear portion of the word line transistor curve at points 632 and 642 for $R_1$ and $R_0$, respectively. By operating in the linear portion during the write operation, the magnitude of the write current for state0 is greater than the magnitude of the write current for state1 (i.e., $I_{W0} > I_{W1}$), as can be seen from FIG. 6B. The large current difference is not needed in the write operation, so a design target is to have the write operation occur in the saturation region of the access transistor.

Figure 7:
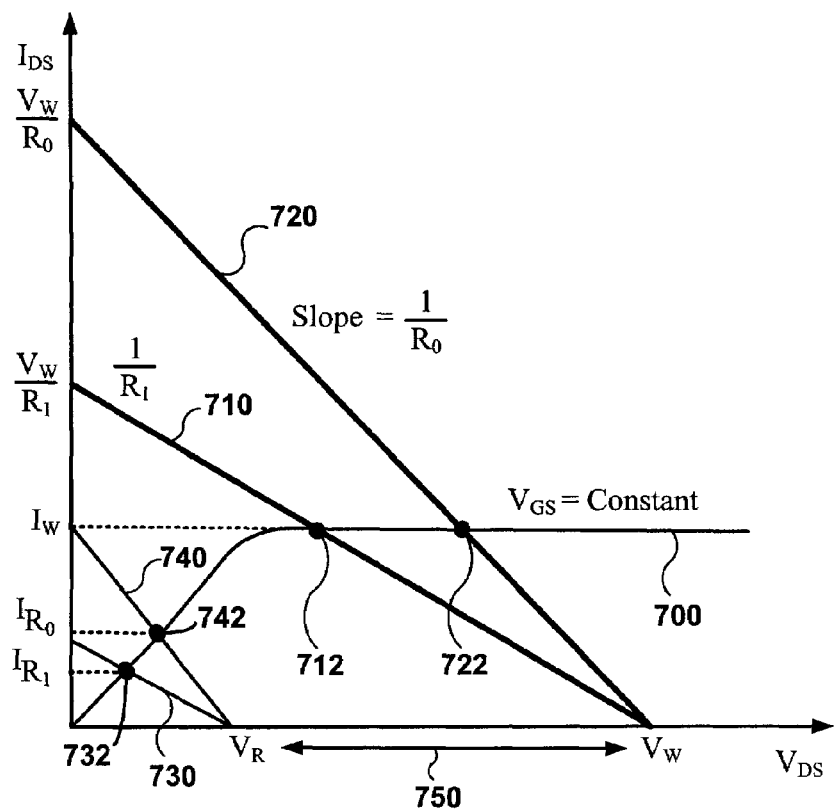
FIG. 7 is a graph illustrating a characteristic curve for a word line transistor and load lines indicating various read and write operating points.

FIG. 7 illustrates an example of combined read and write operating points and related load lines in an exemplary design. In the illustrated example, the gate-source voltage ($V_{GS}$) on the access transistor is considered to be constant so only one curve 700 is plotted for $V_{GS}$. In this design, a load line for the write operation of a state0 720 and a load line for the write operation of a state1 710 for a given write voltage $V_W$ are illustrated. Once again, the load line 720 has a slope of $1/R_0$, where $R_0$ is the state0 resistance of the MTJ. Likewise, load line 710 has a slope of $1/R_1$, where $R_1$ is the state1 resistance of the MTJ. Both lines intersect the drain-source voltage line ($V_{DS}$) at point $V_W$ and can be designed to intersect the saturated region at points 712 and 722 for $R_1$ and $R_0$, respectively. Accordingly, a consistent write current magnitude $I_W$ can be obtained.

In the read operation, it is desired that there is a current differential for the different read states. Accordingly, a load line for the read operation of a state0 740 and a load line for the read operation of a state1 730 is plotted for a given read voltage $V_R$. Load line 740 also has a slope of $1/R_0$, where $R_0$ is the state0 resistance of the MTJ. Likewise, load line 730 also has a slope of $1/R_1$, where $R_1$ is the state1 resistance of the MTJ. It will be appreciated that these slopes generally correspond to the same slopes for the write operation. Both lines intersect the drain voltage line at a read voltage $V_R$. By selecting an appropriate read voltage $V_R$, the load lines can intersect the linear portion of the access transistor curve 700 at points 732 and 742 for $R_1$ and $R_0$, respectively. By operating in the linear portion during the read operation, a detectable difference can be established between the read current for state0 and the read current for state1 (i.e., $I_{R0} > I_{R1}$), as can be seen from FIG. 7.

The example illustrated in FIG. 7 achieves at least the following design targets.

Read operating point: Linear region of the access transistor
Write operating point : Saturation region of the access transistor
Read current is smaller than the Write current to prevent destructive reads As noted in the foregoing, the read operation occurs in the linear region so the read current for state0 is going to be greater than the read current for state1 (i.e., $I_0 > I_1$). Accordingly, a significant current difference between state0 and state1 makes it easier to detect the state of the MTJ and read errors can be reduced. The greater the current difference between the read states, the more resilient the design will be to process, voltage and temperature (PVT) variations experienced by all circuits. Likewise, designing the write operations to occur in the saturation region at a higher current than either read currents (i.e., $I_W >> I_0 > I_1$) can improve the tolerance PVT variations, with respect to the destructive read problem discussed in the foregoing. This can be achieved by having a greater write voltage ($V_W$) than the read voltage ($V_R$), as illustrated. The difference 750 between the write voltage and read voltage is a design parameter that can be determined based on the expected PVT variations and access transistor characteristic curves for a given design.

Figure 8:
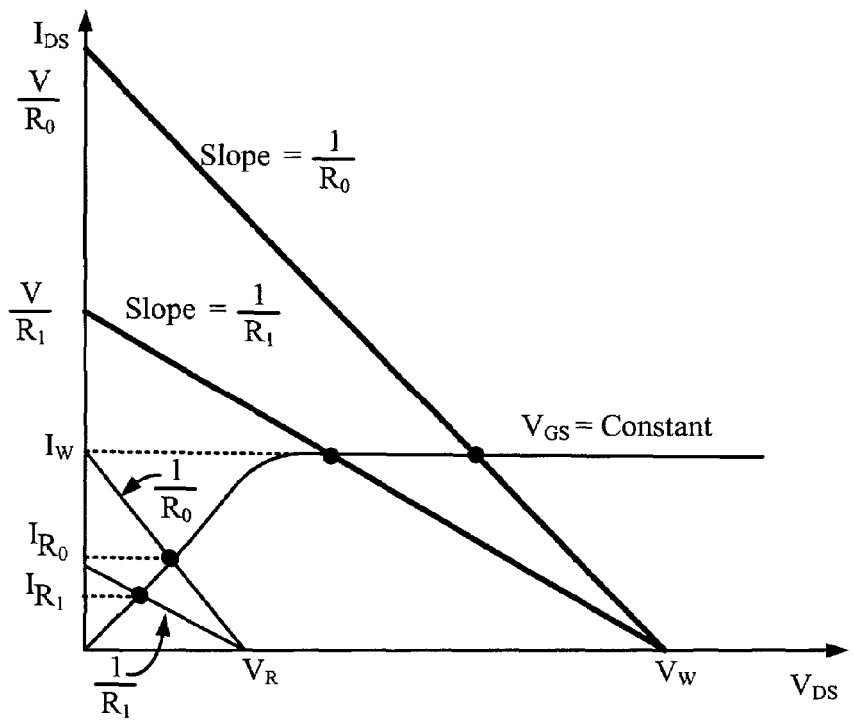
FIG. 8 is a graph illustrating a characteristic curve for a word line transistor and load lines indicating various read and write operating points.

FIG. 8 is a generalized graph illustrating various read and write operating points according to embodiments of the invention. The elements of the graph can be obtained from various parameters of the STT-MRAM cell design. These parameters include the state0 ($R_0$) and state1 ($R_1$) resistances of the MTJ and a characteristic curve for the access transistor for a given voltage ($V_{GS}$), for example. The write voltage ($V_W$) then can be selected to intercept the saturation region and the read voltage ($V_R$) can be set to intercept the linear region, base on the write and read load lines. Additionally, the read and write voltages can be set to ensure that the maximum read current (e.g., $I_{R0}$) is less than the write current ($I_W$) and a minimum write current to meet the design targets discussed above. The minimum write current ($I_{Wmin}$) can be determined by considering cell current, MTJ resistance variations, cell size and $V_t$. The minimum write current can be established to be greater than the calculated minimum write current.

A simple circuit design can be achieved using only one power supply (e.g., supply voltage ($V_{DD}$) and ground) and generating an intermediate voltage for the read voltage ($V_R$). An exemplary configuration can have the following configuration:

$V_{DD}$, 0 and $V_R$ as voltage levels
$V_{WL} = V_{DD}$ for both read and write
$V_{BL} = V_{DD}$ (0) and $V_{SL} = 0$ ($V_{DD}$) for write
$V_{BL} = V_R$ and $V_{SL} = 0$ for read In the foregoing, $V_{DD}$ is a supply voltage, $V_R$ is the read voltage, $V_{WL}$ is the word line voltage, $V_{BL}$ is the bit line voltage, and $V_{SL}$ is the source line voltage. The foregoing parameters uses only one DC voltage generator for $V_R$. As noted above, both the bit line and the source line voltage is coupled to ground (0) or $V_{DD}$ during the write operations, depending on the state being written. The source line voltage is set to ground (0) during the read and the bit line is set to $V_R$. The word line voltage is coupled to $V_{DD}$ for both read and write, when enabled. Accordingly, all operating states can be achieved with only $V_{DD}$, $V_R$ and ground (0) as voltage levels. Appropriate selection of $V_{DD}$ and $V_R$ in combination of the characteristic curves of the access transistor can allow for the design targets discussed above to be achieved (i.e., read operating point in the linear region of the access transistor; write operating point in the saturation region of the access transistor; and read current being smaller than the write current) with a minimum number of DC voltages.

Accordingly, an embodiment of the invention can include a Spin Transfer Torque Magnetoresistive Random Access Memory (STT-MRAM) having a plurality of bit cells. Each cell can include a magnetic tunnel junction (MTJ) storage element having a state0 resistance and state1 resistances and an access transistor, such as illustrated in FIG. 4A. The access transistor can be coupled in series with the MTJ between a bit line and a source line. A gate of the access transistor can be coupled to a word line (WL). A supply voltage ($V_{DD}$) can be applied to the bit line or source line during write operations. The other line (bit line or source line) not coupled to $V_{DD}$ can be coupled to ground to permit the write operations for both states, as discussed above. A read voltage ($V_R$) can be applied to the bit line during a read operation and the source line can be set to ground or 0 volts. Additionally, the WL can be coupled to $V_{DD}$ during both the read and write operations. As discussed above, the read voltage can be selected such that the access transistor operates in a linear region during read operations and the write voltage ($V_{DD}$) can be selected so the access transistor operates in a saturation region during read operations.

Figure 9:
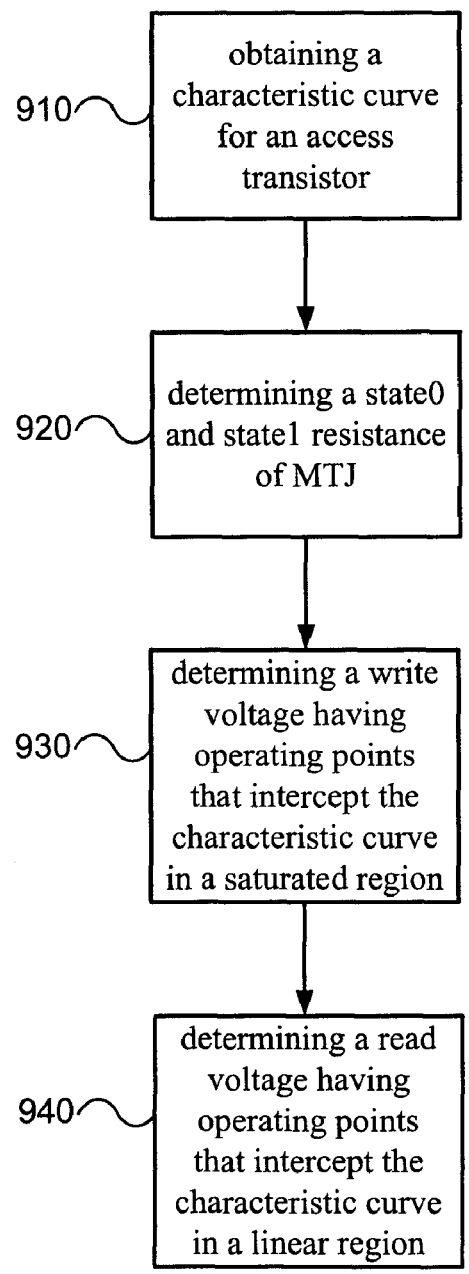
FIG. 9 is a flowchart illustrating a design method to determine various operating points of a STT-MRAM bit cell.

In view of the foregoing it will be appreciated that methods for performing the various sequence of actions, steps, functions and/or algorithms are included in embodiments of the invention. Accordingly, referring to FIG. 9, an embodiment of the invention can include a method for designing Spin Transfer Torque Magnetoresistive Random Access Memory (STT-MRAM) comprising: obtaining a characteristic curve for an access transistor, 910. The state0 resistance and a state1 resistance of a magnetic tunnel junction (MTJ) storage element can be determined, 920, corresponding to a first and second state of the memory. A write voltage can be determined, 930, such that the operating points of both the first state and second state write operations intercept the characteristic curve in a saturated region. Then, a read voltage can be determined, 940, such that the operating points of both the first state and second state read operations intercept the characteristic curve in a linear region. Additionally, a maximum read current is established to be less than a minimum write current.

Further, the effect of process, voltage and temperature (PVT) variations can be determined over a plurality of bit cells in a memory array. Each bit cell has the MTJ, an access transistor and similar write voltages and read voltages. Accordingly, the impact of PVT variations can be evaluated and the design can be evaluated to ensure it will successfully operate over the expected range of variation, which can be determined from information readily available to design engineers (e.g., characteristic curves for various access transistor designs) and by limits imposed by design engineers (e.g., minimum and maximum operating voltage and temperature). If the original design is not determined to be acceptable, at least one of the state0 resistance, the state1 resistance, the write voltage or read voltage can be adjusted based on the determined impact of the PVT variations and the process of FIG. 9, for example, can be repeated. Additionally, a different access transistor design with different characteristic curves can be considered. Accordingly, a memory design can be determined such that each of the plurality of bit cells have write operations that intercept the characteristic curve in the saturated region and each of the read operations intercept the characteristic curve in a linear region.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal. Accordingly, an embodiment of the invention can include a user terminal configured to perform the design processes described in the foregoing.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Accordingly, an embodiment of the invention can include a computer-readable medium including code stored thereon for designing Spin Transfer Torque Magnetoresistive Random Access Memory (STT-MRAM) comprising: code for causing a computer to load a characteristic curve for an access transistor, code for causing a computer to determine a state0 resistance and a state1 resistance of a magnetic tunnel junction (MTJ) storage element, corresponding to a first and second state of the memory, code for causing a computer to determine a write voltage such that the operating points of both the first state and second state write operations intercept the characteristic curve in a saturated region, and code for causing a computer to determine a read voltage such that the operating points of both the first state and second state read operations intercept the characteristic curve in a linear region. Further, any of the functions describe herein can be included in as additional code in further embodiments of the invention.

While the foregoing disclosure shows illustrative embodiments of the invention, it should be noted that various changes and modifications could be made herein without departing from the scope of embodiments of the invention as defined by the appended claims. The functions, steps and/or actions of the methods in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method for designing Spin Transfer Torque Magnetoresistive Random Access Memory (STT-MRAM) comprising:
   obtaining a characteristic curve for an access transistor;
   determining a state0 resistance and a state1 resistance of a magnetic tunnel junction (MTJ) storage element, corresponding to a first and second state of the memory;
   determining a write voltage such that the operating points of both the first state and second state write operations intercept the characteristic curve in a saturated region; and
   determining a read voltage such that the operating points of both the first state and second state read operations intercept the characteristic curve in a linear region.

2. The method of claim 1 further comprising:
   establishing a maximum read current to be less than a minimum write current.

3. The method of claim 2, wherein the maximum read current is determined based on process, voltage and temperature (PVT) variation parameters of at least one of the state0 resistance of the MTJ, the state1 resistance of the MTJ, the characteristic curve of the access transistor, or the read voltage.

4. The method of claim 3, wherein the PVT variation is modeled over a plurality of bit cells in a memory array.

5. The method of claim 2, wherein the minimum write current is determined based on process, voltage and temperature (PVT) variation parameters of at least one of the state0 resistance of the MTJ, the state1 resistance of the MTJ, the characteristic curve of the access transistor, or the write voltage.

6. The method of claim 5, wherein the PVT variation is modeled over a plurality of bit cells in a memory array.

7. The method of claim 5, wherein the read voltage is substantially less than the write voltage.

8. The method of claim 1, wherein the write voltage is determined to be a supply voltage.

9. The method if claim 1, further comprising:
determining the effect of process, voltage and temperature (PVT) variations over a plurality of bit cells in a memory array, each bit cell having a MTJ with state0 and state1 resistances, an access transistor, a write voltage and a read voltage.

10. The method of claim 9, further comprising:
adjusting at least one of the state0 resistance, the state1 resistance, the write voltage or read voltage, based on the determined effect of the PVT variations such that each of the plurality of bit cells have write operations that intercept the characteristic curve in the saturated region and read operations that intercept the characteristic curve in a linear region.

11. A Spin Transfer Torque Magnetoresistive Random Access Memory (STT-MRAM) having a plurality of bit cells, each bit cell comprising:
a magnetic tunnel junction (MTJ) storage element having a state0 resistance and a state1 resistance, corresponding to a first and second state of the memory;
an access transistor coupled in series with the MTJ between a bit line and a source line, wherein a gate of the access transistor is coupled to a word line;
a supply voltage ($V_{DD}$) coupled to the bit line or source line during write operations; and
a read voltage ($V_R$) coupled to the bit line during a read operation, and
wherein the read voltage is selected such that the access transistor operates in a linear region during read operations and wherein the access transistor operates in a saturation region during write operations.

12. The STT-MRAM of claim 11, wherein the source line is coupled to a ground potential during the read operation.

13. The STT-MRAM of claim 11, wherein the gate-source voltage ($V_{GS}$) of the access transistor is substantially the same value during the read and write operations.

14. The STT-MRAM of claim 13, wherein the supply voltage is coupled to the word line during both the read and write operations.

15. A computer-readable medium including code stored thereon for designing Spin Transfer Torque Magnetoresistive Random Access Memory (STT-MRAM) comprising:
code for causing a computer to load a characteristic curve for an access transistor;
code for causing a computer to determine a state0 resistance and a state1 resistance of a magnetic tunnel junction (MTJ) storage element, corresponding to a first and second state of the memory;
code for causing a computer to determine a write voltage such that the operating points of both the first state and second state write operations intercept the characteristic curve in a saturated region; and
code for causing a computer to determine a read voltage such that the operating points of both the first state and second state read operations intercept the characteristic curve in a linear region.

16. The computer-readable medium of claim 15, further comprising:
code for causing a computer to establish a maximum read current to be less than a minimum write current.

17. The computer-readable medium of claim 15, wherein the write voltage is determined to be a supply voltage.

18. The computer-readable medium of claim 15, wherein the read voltage is determined to be substantially less than the write voltage.

19. The computer-readable medium of claim 15, further comprising:
code for causing a computer to determine the effect of process, voltage and temperature (PVT) variations over a plurality of bit cells in a memory array, each bit cell having a MTJ with state0 and state1 resistances, an access transistor, a write voltage and a read voltage.

20. The computer-readable medium of claim 19, further comprising:
code for causing a computer to adjust at least one of the state0 resistance, the state1 resistance, the write voltage or read voltage, based on the determined effect of the PVT variations so that each of the plurality of bit cells have write operations that intercept the characteristic curve in the saturated region and read operations that intercept the characteristic curve in a linear region.

* * * * *

UNITED STATES PATENT AND TRADEMARK OFFICE
CERTIFICATE OF CORRECTION

PATENT NO. : 7,764,537 B2  
APPLICATION NO. : 11/972674  
DATED : July 27, 2010  
INVENTOR(S) : Seong-Ook Jung et al.

Page 1 of 1

It is certified that error appears in the above-identified patent and that said Letters Patent is hereby corrected as shown below:

Title Page, Item [73], After the first assignee add the following:

Industry-Academic Cooperation Foundation, Yonsei University, Seoul, Korea (KR)

To be listed as follows:

[73]  Assignees: QUALCOMM Incorporated, San Diego, CA (US)
   Industry-Academic Cooperation Foundation, Yonsei University, Seoul, Korea (KR)

Signed and Sealed this
Fifth Day of July, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,764,537 B2 | Page 1 of 1 |
| APPLICATION NO. | : 11/972674 | |
| DATED | : July 27, 2010 | |
| INVENTOR(S) | : Jung et al. | |

It is certified that error appears in the above-identified patent and that said Letters Patent is hereby corrected as shown below:

Column 11, line 7, claim 9: "if claim 1," to read as --of claim 1,--

Signed and Sealed this
Twelfth Day of July, 2011

David J. Kappos
*Director of the United States Patent and Trademark Office*